United States Patent
Zhang

(10) Patent No.: US 7,311,874 B2
(45) Date of Patent: Dec. 25, 2007

(54) SPUTTER TARGET AND METHOD FOR FABRICATING SPUTTER TARGET INCLUDING A PLURALITY OF MATERIALS

(75) Inventor: Wenjun Zhang, Suzhou (CN)

(73) Assignee: Heraeus Inc., Chandler, AZ (US)

( * ) Notice: Subject to any disclaimer, the term of this patent is extended or adjusted under 35 U.S.C. 154(b) by 211 days.

(21) Appl. No.: 10/739,401

(22) Filed: Dec. 19, 2003

(65) Prior Publication Data

US 2004/0208774 A1    Oct. 21, 2004

Related U.S. Application Data

(63) Continuation-in-part of application No. 10/200,590, filed on Jul. 23, 2002, now Pat. No. 6,759,005.

(51) Int. Cl.
*B22F 3/14*    (2006.01)
*B22F 3/15*    (2006.01)

(52) U.S. Cl. .......................... 419/32; 419/28; 419/48; 419/49

(58) Field of Classification Search .................. 419/28, 419/31, 34, 48, 49, 32; 75/230
See application file for complete search history.

(56) References Cited

U.S. PATENT DOCUMENTS

| | | | |
|---|---|---|---|
| 4,609,528 A | 9/1986 | Chang et al. | |
| 4,612,165 A | 9/1986 | Liu et al. | |
| 4,613,368 A | 9/1986 | Chang et al. | |
| 4,731,116 A * | 3/1988 | Kny | 75/238 |
| 4,820,393 A * | 4/1989 | Brat et al. | 204/192.15 |
| 4,917,722 A | 4/1990 | Kuniya et al. | |
| 5,320,729 A * | 6/1994 | Narizuka et al. | 204/298.13 |
| 5,415,829 A * | 5/1995 | Ohhashi et al. | 419/23 |
| 5,470,527 A | 11/1995 | Yamanobe et al. | |
| 5,530,467 A | 6/1996 | Ishigami et al. | |
| 5,561,833 A | 10/1996 | Tomioka et al. | |
| 5,618,397 A * | 4/1997 | Kano et al. | 204/298.13 |
| 5,652,877 A | 7/1997 | Dubois et al. | |
| 5,778,302 A | 7/1998 | Ivanov | |
| 5,863,398 A | 1/1999 | Kardokus et al. | |
| 5,896,553 A | 4/1999 | Zo | |

(Continued)

FOREIGN PATENT DOCUMENTS

CN    402642    4/1986

(Continued)

*Primary Examiner*—Roy King
*Assistant Examiner*—Ngoclan T. Mai
(74) *Attorney, Agent, or Firm*—McDermott Will & Emery LLP

(57) ABSTRACT

A method of fabricating a sputter target comprises: homogenously blending a plurality of powders including at least a first powder and a second powder. The first powder is comprised of chromium (Cr), cobalt (Co), ruthenium (Ru), nickel (Ni), or iron (Fe). The second powder is comprised of boron (B), carbon (C), a nitrogen (N)-containing material, a boride, a carbide, a nitride, a silicide, an oxygen (O)-containing material or an oxide. The second powder has a particle size of between 0.01 microns and 50 microns. The method further comprises: canning the blended plurality of powders to form a substantially non-segregated encapsulated powdered material mix; pressing the encapsulated powdered material mix to form a billet; and machining the billet to form a sputter target.

20 Claims, 1 Drawing Sheet

Process Flow Chart for the Production of B/C/N/O/Si Doped Sputtering Targets

U.S. PATENT DOCUMENTS

| | | |
|---|---|---|
| 5,989,673 A | 11/1999 | Xiong et al. |
| 6,261,984 B1 | 7/2001 | Mochizuki et al. |
| 6,264,813 B1 | 7/2001 | Leroy et al. |
| 6,309,593 B1 | 10/2001 | Sato et al. |
| 6,328,927 B1 | 12/2001 | Lo et al. |
| 6,406,600 B1 * | 6/2002 | Takashima ............ 204/298.13 |
| 6,417,105 B1 | 7/2002 | Shah et al. |
| 6,589,311 B1 | 7/2003 | Han et al. |
| 6,676,728 B2 | 1/2004 | Han et al. |
| 6,797,137 B2 * | 9/2004 | Sandlin et al. ......... 204/298.13 |

FOREIGN PATENT DOCUMENTS

| | | |
|---|---|---|
| EP | 1 112 988 | 7/2001 |
| EP | 1 118 690 | 7/2001 |
| EP | 1 233 082 | 8/2002 |
| JP | 10-183341 | 7/1998 |
| KR | 0184725 | 4/1999 |
| WO | WO 99/19102 | 4/1999 |
| WO | WO 01/38599 | 5/2001 |

* cited by examiner

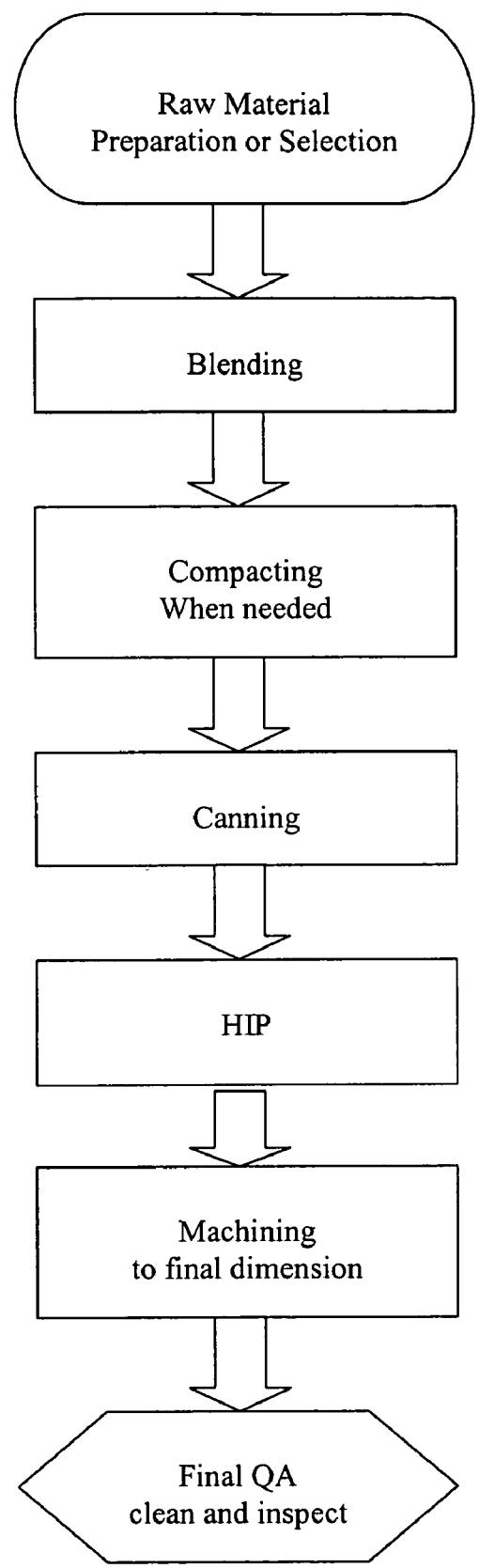
Figure 1. Process Flow Chart for the Production of B/C/N/O/Si Doped Sputtering Targets

SPUTTER TARGET AND METHOD FOR FABRICATING SPUTTER TARGET INCLUDING A PLURALITY OF MATERIALS

CROSS-REFERENCE TO RELATED APPLICATIONS

This application is a continuation-in-part of, and claims priority to application Ser. No. 10/200,590, filed Jul. 23, 2002 now U.S. Pat. No. 6,759,005.

FIELD OF INVENTION

The invention is directed to sputtering targets and methods of fabricating sputtering targets and, in particular examples, to sputtering targets and methods of fabricating sputtering targets doped with non-metal additions including boron, carbon, nitrogen, or oxygen preferably in the form of borides, carbides, nitrides or oxides of transition or refractory elements, by using atomized or crushed alloy powder or ultra fine boride, carbide, nitride or oxide, by hot pressing or hot isostatic pressing, and products produced thereby.

BACKGROUND OF THE INVENTION

Cathodic sputtering processes are widely used for the deposition of thin films of material onto desired substrates. A typical sputtering system includes a plasma source for generating an electron or ion beam, a target that comprises a material to be atomized and a substrate onto which the sputtered material is deposited. The process involves bombarding the target material with an electron or ion beam at an angle that causes the target material to be sputtered or eroded. The sputtered target material is deposited as a thin film or layer on the substrate.

The target materials for sputtering process range from pure metals to ever more complicated alloys. The use of complex 3 to 6 element alloys is common in the sputtering industry. Alloying additions such as boron, carbon, nitrogen, oxygen, silicon and so on are frequently added to Cr-, Co-, Fe-based alloys and other intermetallic alloys to modify characteristics such as deposited film grain-size, surface energy and magnetic properties.

The presence of non-metal additions like boron, carbon, nitrogen, oxygen and silicon to target materials is either in the form of pure elements, e.g. boron and carbon, or in the form of compounds like nitride and oxide. The pure element phases such as boron and carbon and the compound phases like boride, carbide, nitride, oxide, and silicide, however cause spitting problems during sputtering. The present invention provides a solution to this problem.

SUMMARY OF THE INVENTION

According to one embodiment, the present invention relates to a novel method of fabricating sputtering targets that are doped with non-metals such as boron, carbon, nitrogen, oxygen and silicon or mixtures thereof or compounds of non-metals and products produced by these processes. According to one embodiment, a process comprises preparation of a pre-alloyed powder or selection of ultra fine compound powder of about 0.01 to 50 microns, preferably 0.1 to 10 microns, more preferably 1.0 to 5.0 microns average particle size and most preferably less than 2 microns. It has been discovered that spitting will not occur when the above phases are in form of ultra fine particles of less than 50 microns, preferably less than 10 microns in size.

After the ultra fine powders are blended together, the powder blend is canned, followed by a hot isostatic press (HIP) consolidation. Powder processing as above is employed to make the target materials because of unique advantages over the prior art's melting process, both technically and economically.

According to one embodiment of the present invention, a method of fabricating a sputter target comprises: homogenously blending a plurality of powders including at least a first powder and a second powder. The first powder is comprised of chromium (Cr), cobalt (Co), ruthenium (Ru), nickel (Ni), or iron (Fe). The second powder is comprised of boron (B), carbon (C), a nitrogen (N)-containing material, a boride, a carbide, a nitride, or a silicide. The second powder has a particle size of between 0.01 microns and 50 microns. The first powder comprises at least 15 atomic percent or greater. The method further comprises: canning the blended plurality of powders to form a substantially non-segregated encapsulated powdered material mix; pressing the encapsulated powdered material mix to form a billet; and machining the billet to form a sputter target.

According to one embodiment of the present invention, a method of fabricating a sputter target comprises: homogenously blending a plurality of powders including at least a first powder, a second powder, and a third powder. The first powder is comprised of cobalt (Co), ruthenium (Ru), nickel (Ni), or iron (Fe). The second powder is comprised of an oxygen (O)-containing material or an oxide. The third powder is comprised of a transition element or a refractory element. The second powder has a particle size of between 0.01 microns and 50 microns. The method further comprises: canning the blended plurality of powders to form a substantially non-segregated encapsulated powdered material mix; pressing the encapsulated powdered material mix to form a billet; and machining the billet to form a sputter target.

These and other objectives of this invention will become apparent from the following detailed description.

BRIEF DESCRIPTION OF THE DRAWINGS

Reference is now made to the accompanying drawing wherein:

FIG. 1 shows the process flow chart of the invention described herein.

DETAILED DESCRIPTION OF THE INVENTION

The alloy powders of the present invention include alloys and intermetallic alloys composed of 2 to 6 elements, including but not limited to Cr-, Co-, Ru-, Ni-, or Fe-based alloys. The alloy powders contain Cr, Co, Ru, Ni, or Fe, optionally alloyed with Pt or Ta, and include at least one inorganic compound selected from a boride, carbide, nitride or oxide of elements from the Periodical Table of elements shown in columns II to VIIIA, and I to IB.

In preferred embodiments, the non-metallic additive is in combined form such as an inorganic compound of a non-metal although elemental additions may be used if desired. Preferred doping non-metals are compounds of boron, carbon and nitrogen. In still other embodiments compounds of oxygen or silica are included as dopants. Preferred doping compounds are borides, carbides, and nitrides, as well as oxides and silicides. Especially preferred compounds are MoB, AlN (Aluminum Nitride), and $B_4C$, as well as $Al_2O_3$, $Cr_2O_3$, $SiO_2$, and mixtures thereof. The amount of dopant may range from about 1 to 15 atomic percent (at. %), and preferably from 1 to 12 at. %.

In further embodiments, the step of forming the doped elemental powders or alloys is carried out by mechanical mixing to achieve substantially uniform blending of the materials. In further embodiments, the canning step is carried out so as to avoid segregation of the doped element or alloy.

FIG. 1 shows the process flow for making the targets. The first step is the preparation of raw material powders like atomized alloy powders of Ni—Al—B, Fe—B, Fe—C, Fe—Si and so on or the selection of commercially available ultra fine compound powders such as $Al_2O_3$, AlN, MoB and $Cr_2O_3$ of 10 microns or less. Atomized powders have very fine microstructure because of extremely quick cooling and solidification, therefore it is the first choice as raw materials. In some cases powders of fine microstructures can also be made by melting and mechanically crushing ingots much more economically than by atomization, especially for small quantities of powder. Some ultra fine compound powders like $Al_2O_3$, AlN, MoB, $Cr_2O_3$, $B_4C$ and so on are also commercially available, and therefore save both time and money for new product development. Blending of various powders together is preferable because segregation occurs quite often, especially when powders of differing particle size and gravity are combined. Special blending and homogenizing methods include ball milling, v-blending, tubular blending, and attritor milling and/or wet blending. Therefore, it is preferred that the alloy powders and/or mixture be substantially homogeneous for best results.

Proper canning techniques are needed to avoid segregation during canning. Hot pressing in a graphite die could be used as well to consolidate the powder. The powders are canned in preparation for consolidation. In canning for example, a container is filled with the powder, evacuated under heat to ensure the removal of any moisture or trapped gasses present, and then sealed. In vacuum hot pressing, the chamber is continuously evacuated prior to and during load application. Although the geometry of the container is not limited in any manner, the container can possess a near-net shape geometry with respect to the final material configuration.

The encapsulate material from the canning step is then consolidated preferably via Hot-Isostatic-Pressing (HIP), a procedure known in the art. A HIP unit is typically a cylindrical pressure vessel large enough to house one or more containers. The inner walls of the vessel can be lined with resistance heating elements, and the pressure can be controlled by the introduction of inert gas within the container. HIP parameters including temperature, pressure and hold time will be minimized to prevent the growth of compound phases and grain size, as well as to save energy and to protect the environment. Pressures of about 5 to about 60 ksi (preferably 10-20 ksi) at temperatures between about 500° C. to about 1500° C., are typically employed to achieve appropriate densities. Depending upon the complexity of the cycle, total hold times during isostatic pressing typically vary from about 0.5 to about 12 hours. Pressure during vacuum hot pressing is varied from 0.5 to 5 ksi (preferably 1.5 to 2.5 ksi) at temperatures ranging from about 500° C. to 1500° C. (preferably 800-1000° C.). It is noteworthy that other powder consolidation techniques such as hot pressing and cold pressing can also be employed independently or in conjunction with HIP processing.

After consolidation, the solid material form (billet) is removed from the encapsulation can, and a slice of the billet can then be sent to be tested as to various properties of the billet. If desired, the billet can be subjected to optional thermo-mechanical processing to further manipulate the microstructural and macro-magnetic properties of the target. Also, the final shape and size of the sputter targets can be formed, for example, by processes such as wire EDM, saw, waterjet, lathe, grinder, mill, etc. In these steps, the target can be cleaned and subjected to a final inspection.

TABLE 1 alloys manufactured using the method described herein.

| Materials | Typical Chemistry |
|---|---|
| Co—Cr—Pt—B | Co61 at %-Cr15 at %-Pt12 at %-B12 at % |
| Co—Cr—Pt—O—Si | Co56 at %-Cr18 at %-Pt16 at %-$SiO_2$ (0.5-10) mol % |
| Co—Pt—B—C | Co60 at %-Pt20 at %-B16 at %-C4 at % |
| Co—Ta—N | Co50 at %-Ta50 at % doped with nitrogen of 1-4 at. % |
| Co—Ta—Zr—O—Si | Co85 at %-Ta5 at %-Zr5 at %-$SiO_2$ (0.5-10) mol % |
| Co—Ti—Pt—B | Co62 at %-Ti6 at %-Pt12 at %-B20 at % |
| Cr—B | Cr97 at %-B3 at % |
| Cr—Mo—B | Cr80 at %-Mo15 at %-B5 at % |
| Cr—Mo—O | Cr80 at %-Mo20 at % doped with oxygen of 1-4 at. % |
| Cr—O | Cr doped with oxygen of 1-4 at. % |
| Cr—Ti—B | Cr80 at %-Ti16 at %-B4 at % |
| Cr—V—O | Cr80 at %-V20 at % doped with oxygen of 1-4 at. % |
| Cr—V—Zr—O | Cr79 at %-V20 at %-Zr1 at % doped with oxygen of 1-4 at. % |
| Cr—W—O | Cr90 at %-W10 at % doped with oxygen of 1-4 at. % |
| Cr—Zr—O | Cr99 at %-Zr1 at % doped with oxygen of 1-4 at. % |
| Fe—Co—B | Fe56 at %-Co31 at %-B11 at % |
| Fe—Si—Al | Fe73 at %-Si17 at %-Al10 at % |
| Fe—Ta—C | Fe80 at %-Ta8 at %-C12 at % |
| Ni—Al—B | Ni50 at %-Al50 at % doped with boron of 1-4 at. % |
| Ni—Al—N | Ni48 at %-Al48 at % doped with nitrogen of 4 at % |
| Ni—Al—O | Ni50 at %-Al50 at % doped with oxygen of 1-4 at. % |
| Ru—Al—O | Ru50 at %-Al50 at % doped with oxygen of 1-4 at. % |
| Ru—Al—N | Ru50 at %-Al50 at % doped with nitrogen of 1-4 at. % |

EXAMPLES

The following examples demonstrate the present invention further, but should not be construed as a limitation of the present invention. The processes for all materials are similar with each other as shown in FIG. 1, and the main differences are various combinations of raw materials (powders).

Example 1

Production of Cr—Mo Based Sputtering Target with Boron Content—Cr80at %-Mo15at %-B5at %

The above alloy is made with the following powder blends, (1) Cr, Mo and ultra fine MoB compound powder, and (2) Cr, Mo and pre-alloyed Cr-3.1 wt % B powder that is made with a vacuum induction melter at 1730° C. and mechanically crushing cast ingots into powder at room temperature. The pre-alloyed Cr-3.1 wt. % B powder can also be made by gas atomization. Special attention must be paid to mixing all powders together when ultra fine compound powder like MoB is used, otherwise segregation may occur. Herewith an attritor mill or a ball mill must be used for blending from 2 to 24 hours. The HIP parameters for this kind of alloy include the temperature ranging from about 1000-1400° C., at a pressure from about 5-40 ksi and a hold time from about 1-12 hours. The cooling rate must be controlled too, otherwise the HIPed billet may crack during cooling down. A cooling rate of 3° C./min and a hold plateau at 800° C. for 6 hours is introduced to cooling phase.

Example 2

Production Of Co—Cr—Pt Based Sputtering Target with $SiO_2$ Content—Co56at %-Cr18at %-Pt16at %-O3.33at %-Si1.67at %

Two different combinations of starting powders are employed herein. The first is the combination of Co, Cr, Pt and ultra fine $SiO_2$ powder and the second is the combination of Co, Cr, Pt, atomized Co—Si pre-alloy and ultra fine $Cr_2O_3$ powder. The silicides are ultra fine and well dispersed in Co matrix of original gas-atomized Co—Si particles. Special mixing methods using an attritor mill or a ball mill for 2 to 24 hours must be employed here to mix all powders together homogeneously when ultra fine compound powders like $SiO_2$ and $Cr_2O_3$ are used, otherwise segregation may occur. The HIP parameters for this kind of alloy include the temperature ranging from about 600-1400° C., at a pressure from about 5-40 ksi and a hold time from about 1-12 hours.

Example 3

Production of Cr—X (wherein X is boride, carbide, nitride or oxide, or mixtures thereof) Sputtering Target Doped with Oxygen—

Cr80at %-Mo20at % doped with oxygen of 1-4 atomic % (at. %).

Regular Cr, Mo and partly oxidized Cr powder of oxygen level 15000 ppm are used to make the targets. The Cr powder of high oxygen is produced by oxidizing Cr flakes at high temperature and then subjected to mechanical crushing. In this case, only a part of the surface area of Cr powder is covered with oxides. Special attention must be paid to Cr powder of high oxygen level and mixing all powders together in this case, otherwise segregation may occur. Herewith an attritor mill or a ball mill may be used for blending from 2 to 24 hours. The HIP parameters for this kind of alloy include the temperature ranging from about 800-1400° C., at a pressure from about 5-40 ksi and a hold time from about 1-12 hours. The cooling rate must be controlled too, otherwise the HIPed billet may crack during cooling down. A cooling rate of 3° C./min and a hold plateau at 800° C. for 6 hours is introduced to cooling phase.

Example 4

Production of NiAl Sputtering Target Doped with Boron, Oxygen or Nitrogen—Ni50at %-Al50at % Doped with Boron of 1-4 at. %.

Gas-atomized NiAl intermetallic powder and ultra fine $Al_2O_3$ and AlN powder of less than 5 microns in diameter were taken for making NiAl sputtering targets doped with oxygen or nitrogen. Besides gas atomized NiAl powder, boron-doped gas-atomized NiAl powder was also taken for making NiAl sputtering targets doped with boron and borides are ultra fine and well dispersed in the matrix. Conventional gas atomization methods are used to manufacture the powders. Special attention must be paid to mixing all powders together when ultra fine compound powders like $Al_2O_3$ and AlN are used, otherwise segregation may occur. Herewith an attritor mill or a ball mill may be used for blending from 2 to 24 hours. The HIP parameters for this kind of alloy include the temperature ranging from about 900-1400° C., at a pressure from about 5-40 ksi, and a hold time from about 1-12 hours. The cooling rate must be controlled too, otherwise the HIPed billet may crack during cooling down. A power-off furnace cooling and a hold plateau at 700° C. for 4 hours is introduced to cooling phase.

While this invention has been described with reference to several preferred embodiments, it is contemplated that various alterations and modifications thereof will become apparent to those skilled in the art upon a reading of the detailed description contained herein. It is therefore intended that the following claims are interpreted as including all such alterations and modifications as fall within the true spirit and scope of this invention.

I claim:

1. A method of fabricating a sputter target, comprising the steps of:
homogenously blending a plurality of powders including at least a first powder and a second powder, the first powder comprised of chromium (Cr), cobalt (Co), ruthenium (Ru), nickel (Ni), or iron (Fe), the second powder comprised of boron (B), carbon (C), a nitrogen (N)-containing material, a boride, a carbide, a nitride, or a silicide, the second powder having a particle size of between 0.01 microns and 50 microns, the first powder comprising at least 15 atomic percent or greater;
canning the blended plurality of powders to form a substantially non-segregated encapsulated powdered material mix;
pressing the encapsulated powdered material mix to form a billet; and
machining the billet to form a sputter target.

2. The method of fabricating a sputter target according to claim 1, wherein the plurality of powders includes a third powder, the third powder comprised of platinum (Pt) or tantalum (Ta).

3. The method of fabricating a sputter target according to claim 1, wherein the second powder has a particle size of between 0.1 microns and 10 microns.

4. The method of fabricating a sputter target according to claim 1, wherein the second powder has a particle size of between 1.0 microns and 5.0 microns.

5. The method of fabricating a sputter target according to claim 1, wherein the second powder has a particle size of less then 2.0 microns.

6. The method of fabricating a sputter target according to claim 1, wherein the encapsulated material is hot isostatic pressed at a temperature between 500° C. and 1500° C., a pressure between 5 kilopounds force per square inch (ksi) and 60 ksi, and for a time between 0.5 hours and 12 hours.

7. The method of fabricating a sputter target according to claim 6, wherein the encapsulated material is hot isostatic pressed at a pressure between 10 ksi and 20 ksi.

8. The method of fabricating a sputter target according to claim 1, wherein the encapsulated material is vacuum hot pressed at a temperature between 500° C. and 1500° C., and a pressure between 0.5 kilopounds force per square inch (ksi) and 5 ksi.

9. The method of fabricating a sputter target according to claim 8, wherein the encapsulated material is vacuum hot pressed at a pressure between 1.5 ksi and 2.5 ksi.

10. The method of fabricating a sputter target according to claim 8, wherein the encapsulated material is vacuum hot pressed at a temperature between 800° C. and 1000° C.

11. The method of fabricating a sputter target according to claim 1, wherein the second powder is comprised of carbon (C), a nitrogen (N)-containing material, a carbide, a nitride, or a silicide.

12. A method of fabricating a sputter target, comprising the steps of:
 homogenously blending a plurality of powders including at least a first powder, a second powder, and a third powder, the first powder comprised of cobalt (Co), ruthenium (Ru), nickel (Ni), or iron (Fe), the second powder comprised of an oxygen (O)-containing material or an oxide, and the third powder comprised of a transition element or a refractory element, the second powder having a particle size of between 0.01 microns and 50 microns;
 canning the blended plurality of powders to form a substantially non-segregated encapsulated powdered material mix;
 pressing the encapsulated powdered material mix to form a billet; and
 machining the billet to form a sputter target.

13. The method of fabricating a sputter target according to claim 12, wherein the plurality of powders includes a fourth powder, the fourth powder comprised of platinum (Pt) or tantalum (Ta).

14. The method of fabricating a sputter target according to claim 12, wherein the second powder has a particle size of between 0.1 microns and 10 microns.

15. The method of fabricating a sputter target according to claim 12, wherein the second powder has a particle size of between 1.0 microns and 5.0 microns.

16. The method of fabricating a sputter target according to claim 12, wherein the second powder has a particle size of less then 2.0 microns.

17. The method of fabricating a sputter target according to claim 12, wherein the encapsulated material is hot isostatic pressed at a temperature between 500° C. and 1500° C., a pressure between 5 kilopounds force per square inch (ksi) and 60 ksi, and for a time between 0.5 hours and 12 hours.

18. The method of fabricating a sputter target according to claim 17, wherein the encapsulated material is hot isostatic pressed at a pressure between 10 ksi and 20 ksi.

19. The method of fabricating a sputter target according to claim 12, wherein the encapsulated material is vacuum hot pressed at a temperature between 500° C. and 1500° C., and a pressure between 0.5 kilopounds force per square inch (ksi) and 5 ksi.

20. The method of fabricating a sputter target according to claim 19, wherein the encapsulated material is vacuum hot pressed at a temperature between 800° C. and 1000° C.

* * * * *

UNITED STATES PATENT AND TRADEMARK OFFICE
CERTIFICATE OF CORRECTION

PATENT NO.        : 7,311,874 B2
APPLICATION NO.   : 10/739401
DATED             : December 25, 2007
INVENTOR(S)       : Wenjun Zhang It is certified that error appears in the above-identified patent and that said Letters Patent is hereby corrected as shown below:

Title Pg. Item (63) Related U.S. Application Data "Continuation-in-part of application No. 10/200,590, filed on Jul. 23, 2002, now Pat. No. 6,759,005" should be --Continuation-in-part of application No. 10/200,590, filed on Jul. 23, 2002, issued as Pat. No. 6,759,005, and reissued as Patent No. RE40,100 E--.

In column 1, line 10, "now U.S. Pat. No. 6,759,005." should be --, issued as Pat. No. 6,759,005, and reissued as Patent No. RE40,100 E.--.

Signed and Sealed this

Sixteenth Day of September, 2008

JON W. DUDAS
*Director of the United States Patent and Trademark Office*